United States Patent

Kasperkovitz et al.

[11] Patent Number: 6,064,870
[45] Date of Patent: May 16, 2000

[54] INTERFERENCE DETECTION CIRCUIT HAVING AMPLITUDE FREQUENCY DOMAIN DEFINED DISCRIMINATION

[75] Inventors: Wolfdietrich G. Kasperkovitz; Arie Kuehn, both of Eindhoven, Netherlands

[73] Assignee: U.S. Philips Corporation, New York, N.Y.

[21] Appl. No.: 08/927,880

[22] Filed: Sep. 11, 1997

[30] Foreign Application Priority Data

Sep. 18, 1996 [EP] European Pat. Off. ............... 96202597

[51] Int. Cl.[7] ........................................................ H04B 1/00
[52] U.S. Cl. ........................ 455/296; 455/263; 455/278.1
[58] Field of Search .................................... 455/296, 263, 455/278.1, 308, 206, 303, 295, 311

[56] References Cited

U.S. PATENT DOCUMENTS

| | | | |
|---|---|---|---|
| 4,525,868 | 7/1985 | Kage et al. | 455/206 |
| 5,524,125 | 6/1996 | Tsujimoto | 455/278.1 |
| 5,548,838 | 8/1996 | Talwar et al. | 455/296 |
| 5,574,978 | 11/1996 | Talwar et al. | 455/296 |
| 5,584,065 | 12/1996 | Monzello | 455/296 |
| 5,603,087 | 2/1997 | Shutlz | 455/296 |
| 5,778,310 | 7/1998 | Tong et al. | 455/296 |

Primary Examiner—Daniel S. Hunter
Assistant Examiner—Thuan T. Nguyen
Attorney, Agent, or Firm—Edward W. Goodman

[57] ABSTRACT

An interference detection circuit includes a circuit, in particular a non-linear circuit, for defining a discrimination curve in terms of instantaneous magnitude and instantaneous frequency, and a circuit, in particular a differential amplifier, for detecting whether a combination, in particular the product, of the instantaneous magnitude and the instantaneous frequency of the inputted signal exceeds the discrimination curve, in which case, a control circuit controls the gating of the inputted signal. The discrimination defining circuit has a control input for adapting the discrimination curve to the average instantaneous magnitude, in particular, the product of the instantaneous magnitude and the instantaneous frequency of the input signal. Thus, small as well as larger input signal amplitudes on which interference is superimposed can be discriminated adequately and reliably in order to minimize audible effects of leaving out interfered part of the input signal.

17 Claims, 5 Drawing Sheets

INTERFERENCE DETECTION CIRCUIT HAVING AMPLITUDE FREQUENCY DOMAIN DEFINED DISCRIMINATION

BACKGROUND OF THE INVENTION

1. Field of the Invention

The present invention is concerned with an interference detection circuit comprising:

gate means having a gate control for preventing interference in an inputted signal from being outputted, and control means coupled to the gate control for generating a gate control signal.

The present invention is also concerned with a method for detecting interference, wherein an input signal whereon interference is superimposed is prevented from being outputted by gating said input signal by means of a gate control signal.

Furthermore the present invention is concerned with a receiver, comprising a tuner means, a demodulator means having an input coupled with the tuner means and an audio output.

2. Description of the Related Art

Such an interference detection circuit and method are commonly used in the video, or audio field, such as in receivers, car radios, etc., but are also used in measuring equipment and radar appliances.

The generally known interference circuit uses the gate means to leave out that part of the inputted signals on which interference is superimposed. That part is then replaced by a part not polluted with interference.

The known interference circuits suffer from the drawback that the amplitude of detected interferences have to exceed a fixed threshold in order to activate these circuits to generate the gate control signal. Some types of interferences have a small amplitude but can be very disturbing for a relatively weak signal emanating from for example a far away transmitter. Such interferences are poorly detected by the known interference circuits.

Another problem in the prior art circuits is related to the fixing of the threshold. On the one hand this threshold has to be large enough to avoid false interference detection, whereas, on the other hand, this threshold should be low enough to detect annoying interferences.

SUMMARY OF THE INVENTION

The present invention aims at obviating these drawbacks by providing an interference circuit and a method for detecting interference which are capable of reliably detecting several types of interferences, and which allow implementation on a chip at a reasonable cost price.

Thereto the interference detection circuit, according to the present invention, is characterized in that the control means comprises:

means for defining a discrimination curve in terms of magnitude and frequency, and means for detecting whether the combination of the instantaneous magnitude and the instantaneous frequency in the inputted signal exceeds the discrimination curve, in which case, the control means generates the gate control signal.

Accordingly, the method for detecting interference is characterized in that a discrimination curve is defined in terms of magnitude and frequency, whereas the gate control signal is generated if the combination of the instantaneous magnitude and instantaneous frequency in the input signal exceeds the discrimination curve.

Accordingly, the receiver according to the invention is characterized in that the receiver further comprises an interference detection circuit as defined above, this which interference detection circuit being coupled with the audio output of the demodulator means.

The advantage of the interference circuit and interference detecting method according to the invention, is that the advanced instantaneous magnitude (which is independent from its sign, i.e., the same for positive and negative amplitude) and frequency dependent discrimination curve results in a optimum discrimination between interfered and non-interfered inputted signals for several types of interferences. One type of interference, wherein a strong signal interferes with a desired weak signal, can now be discriminated optimally by specifically adjusting the definition of the discrimination curve in terms of its instantaneous magnitude versus instantaneous frequency behavior in the amplitude-frequency domain. In another type of interference wherein large signals having low frequencies suffer from small interferences, these small interferences will also be detected, whereas, generally large signals suffering from relatively small interferences can, at wish, be left unaffected again by specifically defining the discrimination curve in said domain in order to reduce possible audible effects, when the interference circuit according to the invention is used to blank or gate interferences in audio devices.

Interference circuits present in prior art audio devices have a time delay component for conveying the audio signal therethrough. Such a delay component is quite expensive due to the high requirements posed thereon with respect to noise and distortion. It is an advantage of the present invention that it is less expensive because it does not have a delay component, but instead, only has a control means for controlling the blanking of annoying interferences without the necessity to intervene otherwise on the audio signal itself.

One embodiment of the interference circuit according to the invention, is characterised in that the means for defining a discrimination curve in terms of instantaneous magnitude and instantaneous frequency comprises a non-linear transfer function means.

The advantage of this embodiment of the interference circuit, according to the invention, is that it provides a degree of freedom, wherein the design and form of the graph of the discrimination curve can be optimally matched to the desired discrimination properties by choosing the non-linear characteristics of these easily implementable components.

A further embodiment of the interference circuit, according to the invention, is characterized in that the means for defining the discrimination curve in terms of the instantaneous magnitude and the instantaneous frequency of the inputted signal is provided with a reference control input for influencing the position of the discrimination curve in the instantaneous magnitude versus instantaneous frequency domain.

This makes the discrimination between interfered and less, or not, interfered signals even adaptive to, e.g., the instantaneous magnitude of the inputted signal.

One embodiment of the method, according to the invention, is characterized in that the gate control signal for activating the gating or blanking action is generated if an arithmetic relation, in particular an addition or a product, of the instantaneous magnitude and the instantaneous frequency of the input signal, approaches or crosses the defined discrimination curve.

Such an embodiment of the method, according to the invention, has the advantage that it can easily be accomplished by applying a non-linear transfer function means.

A further embodiment of the method, according to the invention, is characterized in that after detection of an interference, the sensitivity for future interferences is influenced during a period of time.

This is easily, but accurately, done by temporarily shifting the adaptive discrimination curve in the amplitude-frequency domain, having the effect of preventing multiple triggering in noisy conditions.

BRIEF DESCRIPTION OF THE DRAWINGS

These and other aspects and advantages of the present invention will be apparent and further elucidated with reference to the embodiments and figures described hereinafter. Similar elements in the separate figures carry the same reference numerals throughout these figures. In the drawings.

DESCRIPTION OF THE PREFERRED EMBODIMENTS

Figure 1:
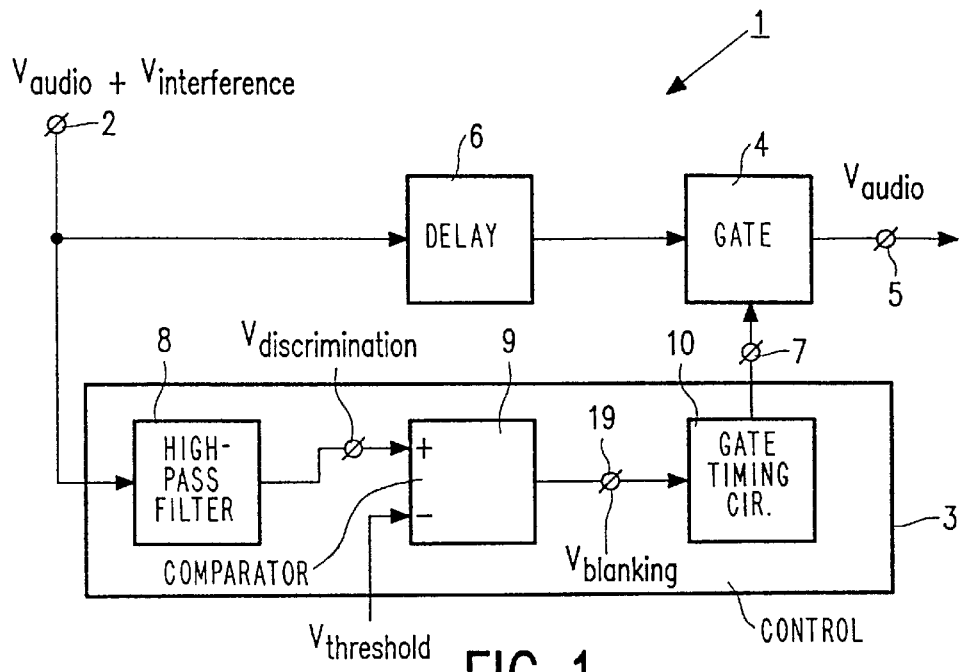
FIG. 1 shows an example of a prior art interference detection circuit.

FIG. 1 shows an embodiment of a prior art interference detection circuit 1 integrated as an AM noise detection circuit. An audio signal $V_{audio}$, on which an interference signal $V_{interference}$ is superimposed, is applied to an input 2 of the detection circuit 1. Upon detection by a control means 3 of an interference in the audio signal on input 2, a gate means 4 is disabled, thereby blocking the input signal from being conveyed to output 5 of the interference detection circuit 1. The interference detection circuit 1 has a delay 6 connected between the input 2 and the gate means 4. The gate means 4 has a gate control 7 on which a gate control signal is generated in order to be able to gate or block the input signal on input 2 at on the right moment, i.e., once the interference is detected and as long as it lasts. The control means 3 of the known interference detection circuit 1 comprises a high-pass filter 8, a comparator 9, and a gate timing circuit 10 for generating the gate control or blanking signal on gate control 7 if only a positive going interference is detected which exceeds a $V_{threshold}$.

Figure 2:
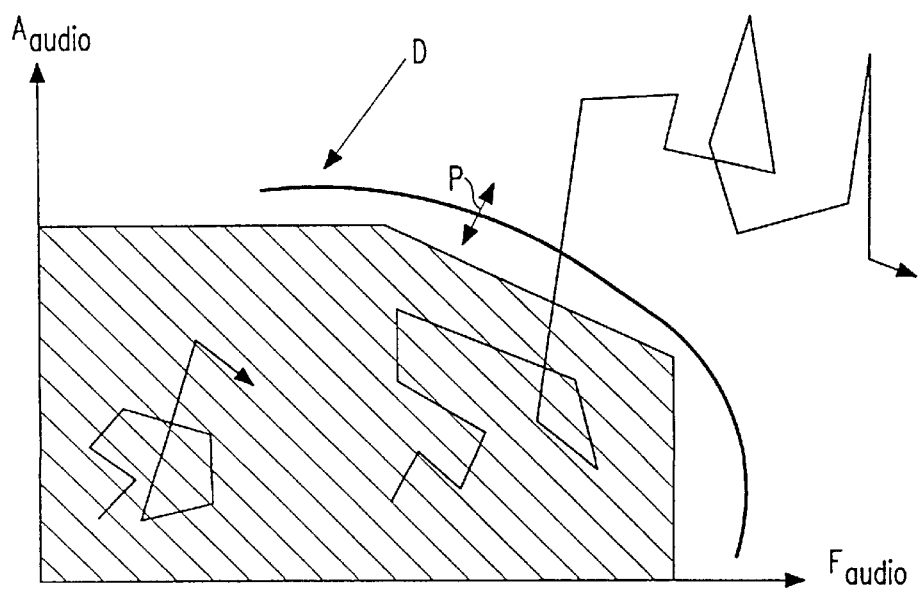
FIG. 2 shows an discrimination curve in the instantaneous amplitude instantaneous frequency domain intended to elucidate the present invention.

FIG. 2 shows a graph of the instantaneous magnitude $A_{audio}$ versus the instantaneous frequency $F_{audio}$, wherein a discrimination curve D is defined to elucidate the notion that input signals, either lie in a dashed area with normally expected instantaneous magnitude and instantaneous frequency, or lie outside that area, in which case an interference will be detected. One could say that the instantaneous vector ($A_{audio}$,$F_{audio}$) either lies inside, or outside the area defined by the discrimination curve.

Figure 3:
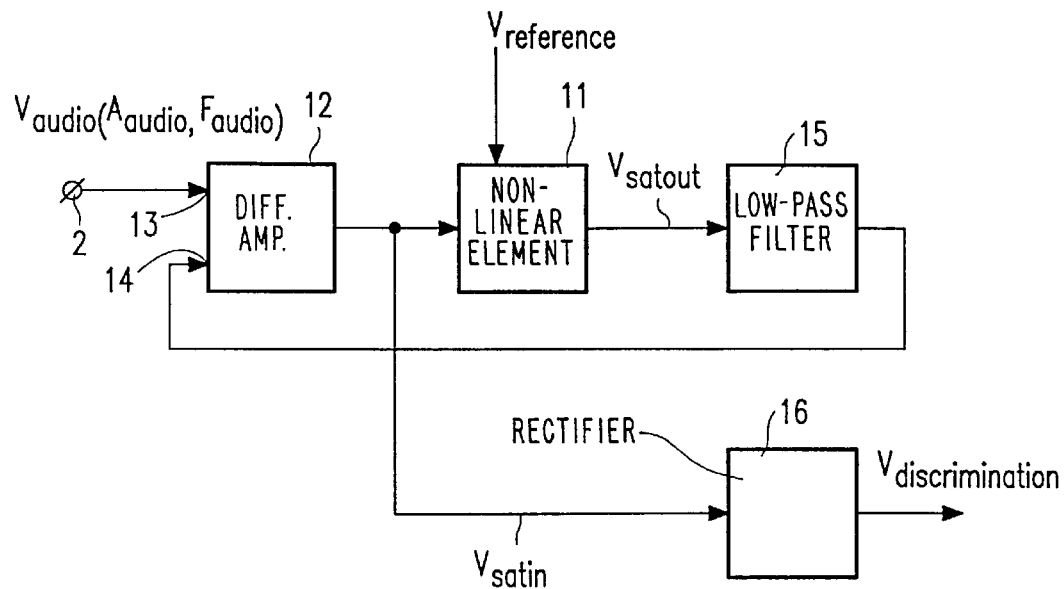
FIG. 3 shows one embodiment of the interference detection circuit according to the invention, having a control means.
Figure 5:
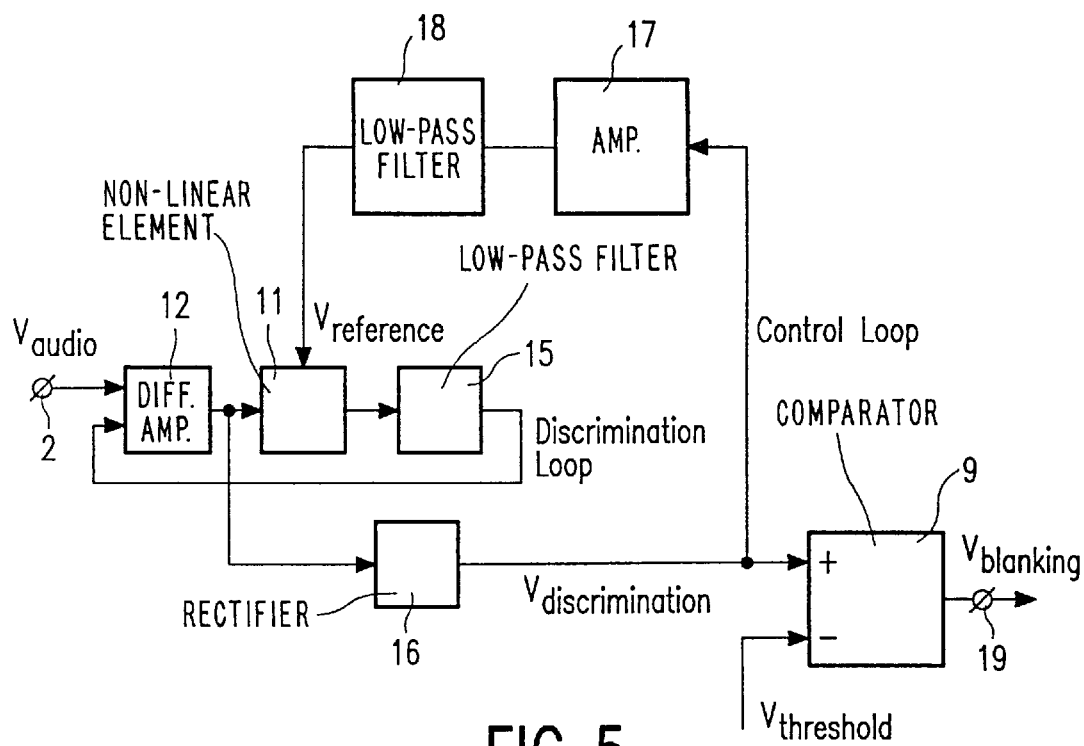
FIG. 5 shows a further control means for application in a second embodiment of the interference detection circuit according to the invention.
Figure 7:
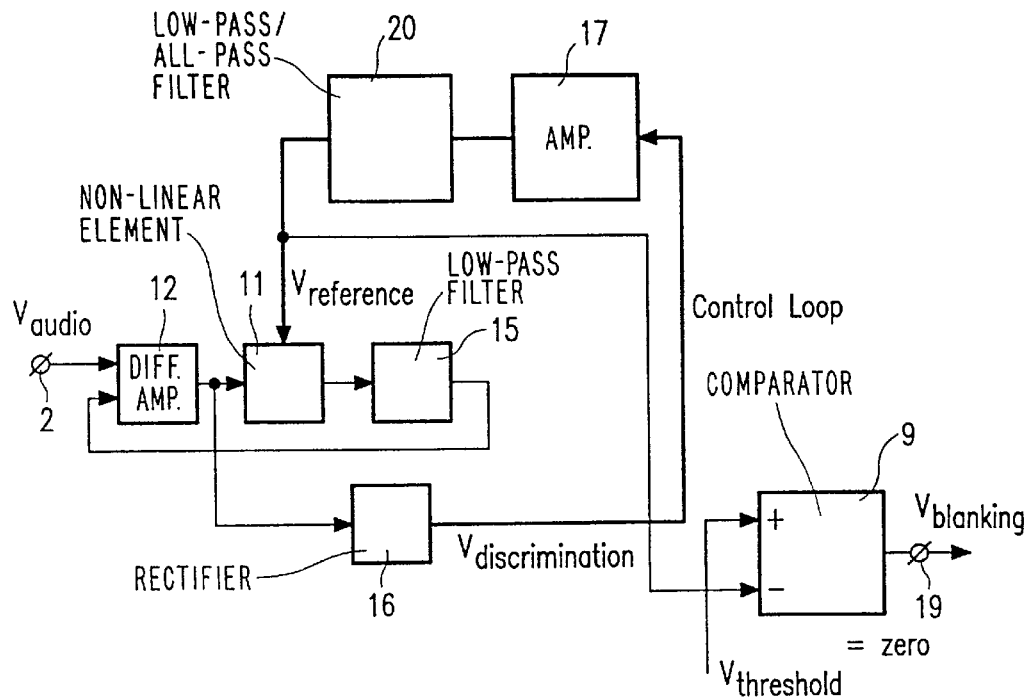
FIG. 7 shows a still further control means for application in a third embodiment of the interference detection circuit according to the invention.

FIGS. 3, 5, and 7 show embodiments of a relevant part of interference detection circuits 1, in particular of the control means 3, wherein the circuits 1 do not include a delay 6, but have, instead, a direct connection between input 2 and the gate means 4. These embodiments to be described comprises means 11 for defining a discrimination curve in terms of instantaneous magnitude and instantaneous frequency. These discrimination curve defining means comprise a non linear transfer function means 11 in the embodiments shown here. Of course such a discrimination curve could also be simulated or defined digitally, e.g., by means of a suitable algorithm or subroutine implemented in a microprocessor.

Figure 4:
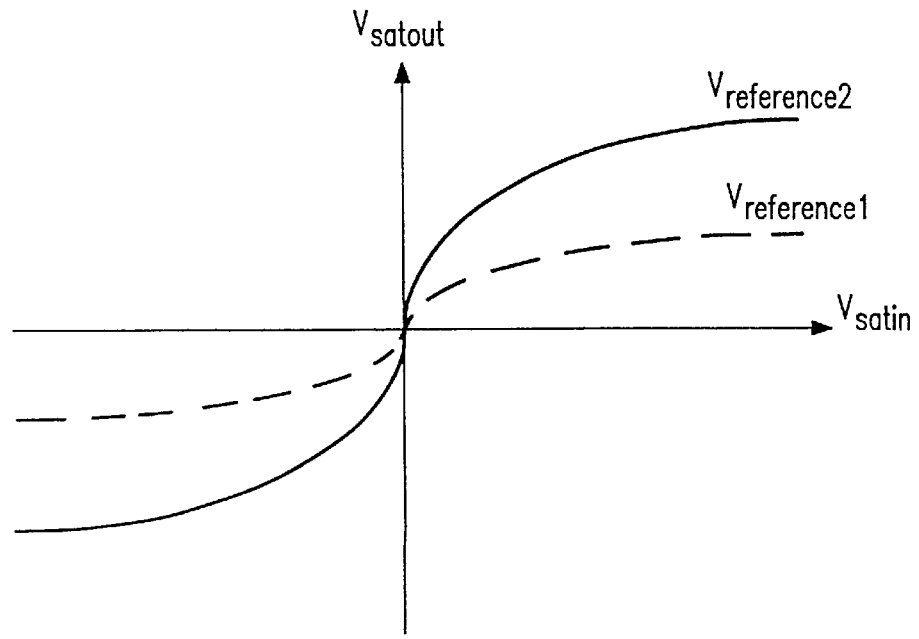
FIG. 4 shows a graph of a possible transfer function of a non-linear transfer function means applied in the interference detection circuit according to the invention.

FIG. 4 illustrates a saturation-like behavior of the non-linear transfer function means 11 showing $V_{satout}$ versus $V_{satin}$ as a function of a possibly applicable $V_{reference}$ values of such means 11. $V_{reference}$ provides the possibility, in the graph of FIG. 2 to adapt the position of the discrimination curve D in the instantaneous magnitude versus instantaneous frequency domain. The directions of the opposite arrows P indicate such directions wherein the curve D may be shifted in dependence on, e.g., the instantaneous amplitude of the signal input on 2. Applying the non-linear means 11 yields an output signal $V_{discrimination}$, which is a non-linear function of the product $A_{audio}$, read instantaneous magnitude, and $F_{audio}$, read instantaneous frequency. This product is only one possible arithmetic relation. Of course, other arithmetic relations may be realized as desired, such as an addition or a more complicated and not symmetric relation between $A_{audio}$ and $F_{audio}$. Such a relation may be realized by analog or digital means not further specified but within the reach of a skilled person. Such a relation may then be made dependent on the parameter $V_{reference}$ in order to facilitate the shifting of the discrimination curve D in said amplitude frequency domain.

The embodiment of FIG. 3 comprises a first loop means comprising a differential amplifier 12 having a first differential input 13 connected to the input 2 and a second differential input 14; the non-linear element 11 interconnected between the differential amplifier 12 and an integrator/low-pass filter means 15, whose output is connected to the second differential input 14. The means for detecting whether the combination of the instantaneous magnitude and the instantaneous frequency of the inputted signal approaches the discrimination curve comprises the differential amplifier 12. After rectifying $V_{satin}$ by means of a rectifier 16, $V_{discrimination}$ results, which contains a measure with respect to the relative distance between the defined discrimination curve and the vector combination of the instantaneous magnitude and frequency in said domain or space. Note that this improved two-dimensional combined discrimination is not influenced by the sign of the interference, whereas the prior art interference detection circuit only responded to interferences having a positive sign. The operation of the FIG. 3 embodiment is such that if the product of $A_{audio}$ and $F_{audio}$ approaches $V_{reference}$, due to the inclination of the graph of FIG. 4, $V_{discrimination}$ increases rapidly in the vicinity of the origin of the graph.

Note further that $V_{reference}$ controls, simultaneously, the slope at small $V_{satin}$ and the saturation value of $V_{satout}$ at large $V_{satin}$, resulting in a further improved interference detection behavior both at small interferences superimposed on small input signals and at larger interferences superimposed on larger input signals.

In the embodiments to be described with reference to FIGS. 5 and 7, effective use is made of $V_{reference}$ which is generated by means of a second loop means being nested in the first loop means described earlier. The second loop means comprises an amplifier 17 receiving by $V_{discrimination}$ for determining the second loop gain, this amplifier 17 being connected to a low-pass filter 18 for determining the dynamic behavior of the second loop. The low-pass filter 18 outputs the control signal $V_{reference}$ for the non-linear transfer function means 11. The operation of these embodiments, which make use of the second loop means, is such that the discrimination level, expressed by $V_{reference}$ is for stationary audio signals automatically adjusted to the average audio signal strength $V_{audio}$. An interference will cause a sharp increase of $V_{discrimination}$ resulting in a trigger signal for the blanking pulse at output 19 of comparator 9.

Figure 6:
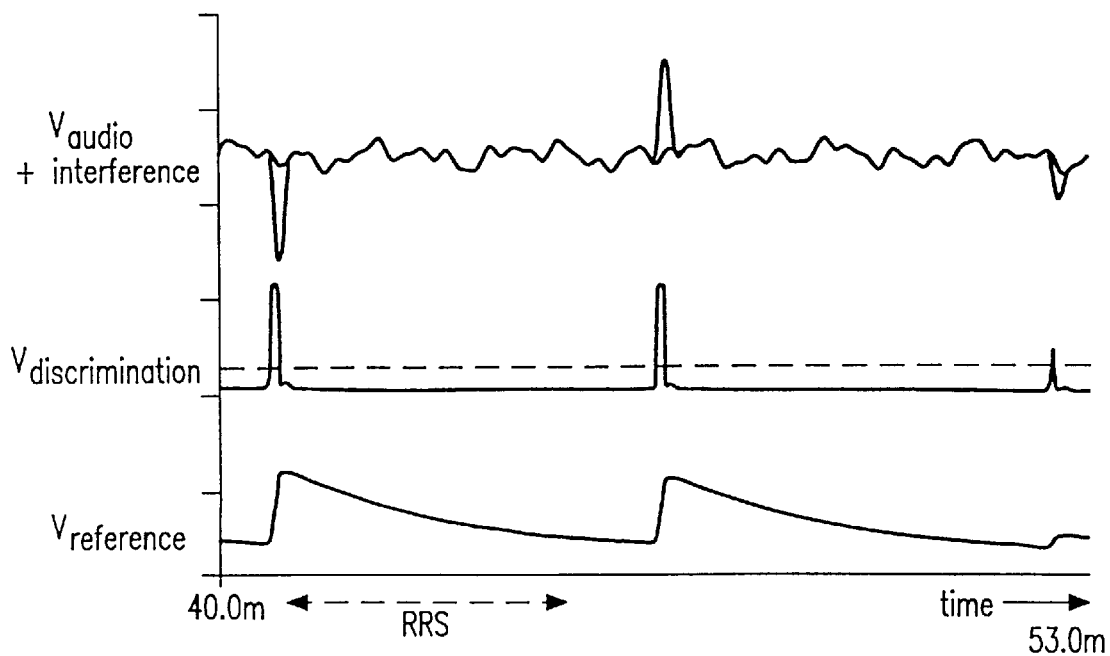
FIG. 6 shows graphs of examples of relevant voltages in the embodiment of FIG. 5.

FIG. 6 indicates what happens if a positive or negative interference arises in the audio signal $V_{audio}$. As a consequence, $V_{discrimination}$ peaks and, due to the low-pass filter action in filter 18, $V_{reference}$ slowly returns to the level it had for stationary audio signals. This means that there is created a region of reduced sensitivity, indicated RRS in FIG. 6, which prevents multiple triggering in noisy conditions, such as will arise more frequently with an ever increasing population density and corresponding potential annoying activity density.

FIG. 7 shows a still more advanced embodiment, wherein amplifier 17 is connected to a cascade 20 of a low-pass filter and an all-pass filter. Here, the start and the stop information for the blanking pulse on output 19 is directly derived from $V_{reference}$ being the filtered version of $V_{discrimination}$.

Figure 8:
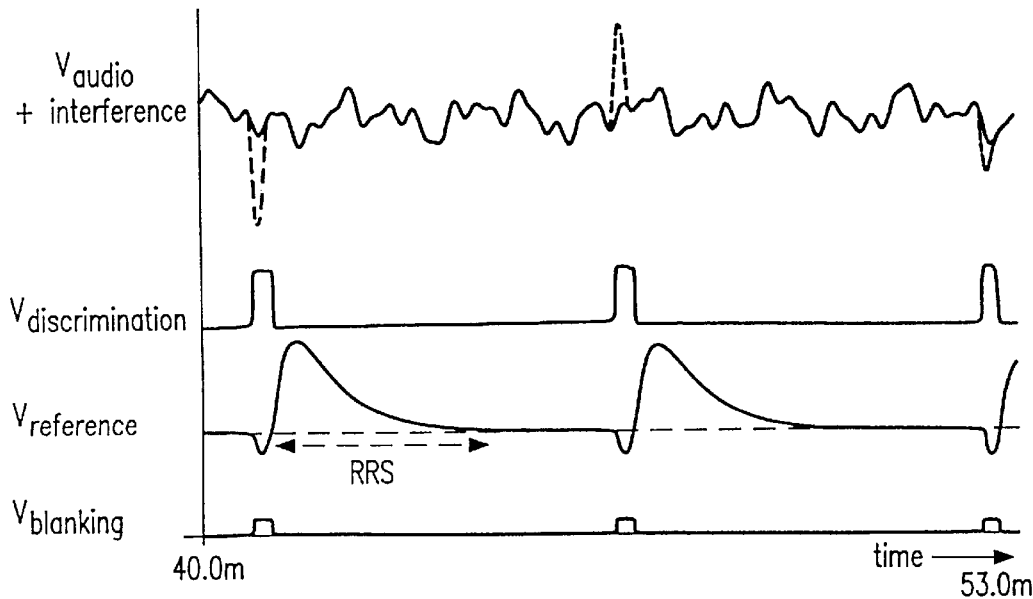
FIG. 8 shows graphs of examples of relevant voltages in the embodiment of FIG. 7.

FIG. 8 shows that due to the all-pass filter action, $V_{reference}$ has a negative precursor as soon as interference is detected. It remains negative during a time interval which is a function of the cut-off frequencies of the low-pass and all-pass filters, and a function of the second loop gain. These parameters can be adjusted such that a directly usable blanking pulse can be generated by the comparator 9, in which case, a separate gate timing circuit can be dispensed with. The threshold voltage of the comparator 9 is zero. Its input polarity is chosen opposite to the embodiment shown in FIG. 5 where the variable threshold voltage of the comparator 9 has to be high in order to start the blanking pulse on output 19.

The first loop means will, of course, respond faster than the second loop means, because the first loop means has to be able to kind of peak through the discrimination curve, whose position P follows the running average of the product of instantaneous magnitude and instantaneous frequency of the input signal. The second loop means, in particular its low-pass filter characteristics, prescribes the time interval of the running average, which determines the position P.

Figure 9:
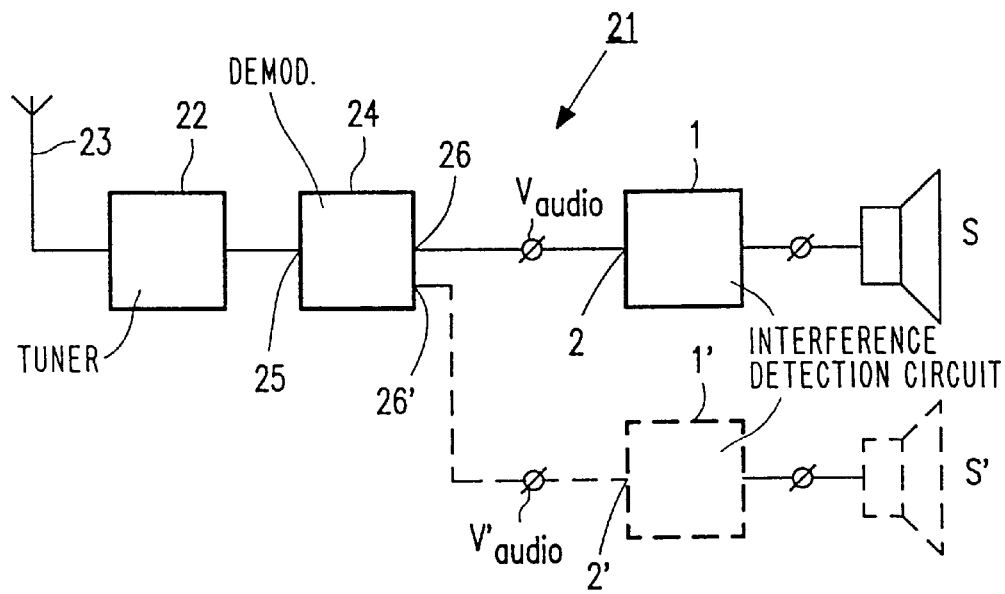
FIG. 9 shows a schematic diagram of a receiver provided with an interference detection circuit according to the invention.

FIG. 9 shows a schematic diagram of a receiver 21, comprising a tuner means 22 coupled to an antenna 23, a demodulator means 24 having an input 25 coupled with the tuner means 22, and an audio output 26 for providing $V_{audio}$ to the interference detection circuit 1, the circuit 1 being coupled between the output 26 and sound reproducing means, such as, e.g., a loudspeaker S. In case of a stereophonic audio signal comprising stereophonic left and right audio signals $V_{audio}$ and $V_{audio}'$ outputted at audio outputs 26 and 26' of the demodulator means 24, an interference detection circuit 1' is coupled between the audio output 26' and sound reproducing means S'. The receiver 21 can be an AM mono- or stereo receiver, or an FM receiver. In case of an AM receiver the demodulator means 24 comprises an AM detector. In case of an FM receiver the demodulator means 24 comprises an FM detector as well as a stereo demultiplexer.

Figure 10:
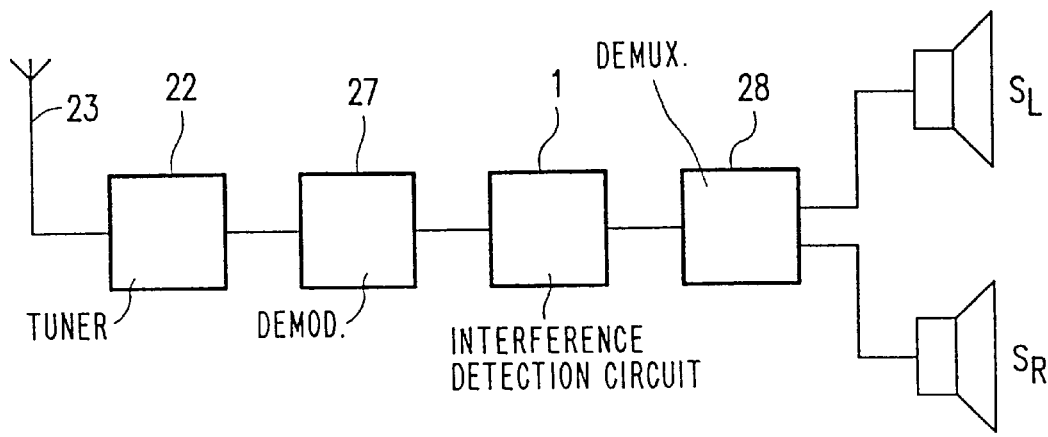
FIG. 10 shows a schematic diagram of an FM stereo receiver provided with an interference detection circuit according to the invention.

FIG. 10 shows a stereophonic FM receiver comprising elements corresponding to those of the receiver of FIG. 9 which are likewise numbered. The tuner means 22 are connected to an FM demodulator 27, supplying a stereo multiplex signal to the interference detection circuit 1. An output of the interference detection circuit 1 is coupled to a demultiplexer 28 for deriving the stereo left and right audio signals from the output signal of the intereference detection circuit 1 and for supplying these signals to respectively, left and right stereo sound reproducing means $S_L$ and $S_R$.

What is claimed is:

1. An interference detection circuit comprising:
    gate means having an input for receiving an input signal, and output for supplying an output signal, and a gate control input for receiving a gate control input, said gate means preventing interference in said input signal from being supplied in said output signal; and
    control means coupled to the gate control input for generating a gate control signal,
    wherein the control means comprises:
    means for defining a discrimination curve in terms of instantaneous magnitude and instantaneous frequency, wherein normally expected input signals lie in an area below the discrimination curve while input signals having interference lie in an area above the discrimination curve; and
    means for detecting whether a combination of the instantaneous amplitude and the instantaneous frequency of the input signal exceeds the discrimination curve, in which case the control means generates the gate control signal.

2. The interference detection circuit as claimed in claim 1, wherein the means for defining a discrimination curve in terms of instantaneous magnitude and instantaneous frequency comprises non-linear transfer function means.

3. The interference detection circuit as claimed in claim 1, wherein the means for defining a discrimination curve in terms of instantaneous magnitude and instantaneous frequency comprises first loop means.

4. The interference detection circuit as claimed in claim 1, wherein the means for detecting whether the combination of the instantaneous magnitude and the instantaneous frequency of the inputted signal exceeds the discrimination curve comprises differential amplification means.

5. The interference detection circuit as claimed in claim 1, wherein the means for defining the discrimination curve in terms of the instantaneous magnitude and the instantaneous frequency of the input signal comprises a reference control input for influencing the position of the discrimination curve in the instantaneous magnitude versus instantaneous frequency domain.

6. The interference detection circuit as claimed in claim 1, wherein the means for defining the discrimination curve in terms of the instantaneous magnitude and the instantaneous frequency of the inputted signal comprises second loop means.

7. The interference detection circuit as claimed in claim 3, wherein the first loop means is nested loop means.

8. The interference detection circuit as claimed in claim 6, wherein the second loop means comprises all-pass filter means.

9. A method for detecting interference, wherein an input signal, on which interference is superimposed, is prevented from being outputted by gating said input signal under control of a gate control signal, wherein said method comprises the steps:

defining a discrimination curve in terms of instantaneous magnitude and instantaneous frequency, wherein normally expected input signals lie in an area below the discrimination curve while input signals having interference lie in an area above the discrimination curve; and generating the gate control signal if a combination of an instantaneous magnitude and instantaneous frequency of the input signal approaches the discrimination curve.

10. The method as claimed in claim 9, wherein the combination of the instantaneous magnitude and instantaneous frequency is based on an arithmetic relation.

11. The method as claimed in claim 10, wherein the arithmetic relation is an addition or a product.

12. The method as claimed in claim 9, wherein said step of defining the discrimination curve is performed adaptively.

13. The method as claimed in claim 12, wherein the adaptive defining is dependent on the instantaneous magnitude of the input signal.

14. The method as claimed in claim 9, after detection of an interference, said method further comprises the step:

influencing a sensitivity for future interferences during a predetermined period of time.

15. The method as claimed in claim 14, wherein said step of influencing comprises increasing the sensitivity for future interferences over the predetermined period of time.

16. A receiver comprising tuner means, demodulator means having an input coupled to the tuner means and an audio output, wherein the receiver further comprises an interference detection circuit comprising:

gate means having an input for receiving an input signal, and output for supplying an output signal, and a gate control input for receiving a gate control input, said gate means preventing interference in said input signal from being supplied in said output signal; and control means coupled to the gate control input for generating a gate control signal, wherein the control means comprises:

means for defining a discrimination curve in terms of instantaneous magnitude and instantaneous frequency, wherein normally expected input signals lie in an area below the discrimination curve, while input signals having interference lie in an area above the discrimination curve; and means for detecting whether a combination of the instantaneous amplitude and the instantaneous frequency of the input signal exceeds the discrimination curve, in which case the control means generates the gate control signal, the input of said gate means of said interference detection circuit being coupled to the audio output of the demodulator means.

17. An FM receiver comprising, tuner means, frequency demodulator means coupled to said tuner means, and demultiplexing means, wherein the FM receiver further comprises an interference detection circuit comprising:

gate means having an input for receiving an input signal, and output for supplying an output signal, and a gate control input for receiving a gate control input, said gate means preventing interference in said input signal from being supplied in said output signal; and control means coupled to the gate control input for generating a gate control signal, wherein the control means comprises:

means for defining a discrimination curve in terms of instantaneous magnitude and instantaneous frequency, wherein normally expected input signals lie in an area below the discrimination curve, while input signals having interference lie in an area above the discrimination curve; and means for detecting whether a combination of the instantaneous amplitude and the instantaneous frequency of the input signal exceeds the discrimination curve, in which case the control means generates the gate control signal, the input of said gate means of said interference detection circuit being coupled to an output of the frequency demodulator means and the output of said gate means being coupled to an input of the demultiplexer means.

\* \* \* \* \*